United States Patent
Kirihata

Patent Number: 5,669,546
Date of Patent: Sep. 23, 1997

[54] APPARATUS FOR MANUFACTURING SEMICONDUCTOR DEVICE AND METHOD OF MANUFACTURING THE SEMICONDUCTOR DEVICE USING THE SAME

[75] Inventor: Fumiaki Kirihata, Kawasaki, Japan

[73] Assignee: Fuji Electric Co., Ltd., Kawasaki, Japan

[21] Appl. No.: 402,172

[22] Filed: Mar. 13, 1995

[30] Foreign Application Priority Data

Mar. 17, 1994 [JP] Japan .................................. 6-046259
Feb. 15, 1995 [JP] Japan .................................. 7-026421

[51] Int. Cl.$^6$ .................................................. B23K 1/18
[52] U.S. Cl. .................................................. 228/123.1
[58] Field of Search ...................... 228/123.1, 180.21, 228/180.22

[56] References Cited

U.S. PATENT DOCUMENTS 4,892,245  1/1990  Dunaway et al. ............... 228/180.22
5,261,157  11/1993  Chang ............................... 29/844

FOREIGN PATENT DOCUMENTS 2 487 579  1/1982  France .

OTHER PUBLICATIONS

Patent Abstracts of Japan, Vol. 10, No. 309(E–447)(2365), Oct. 21, 1986, JP61–123163, Mitsubishi Electric Corp.

*Primary Examiner*—Kenneth J. Ramsey
*Attorney, Agent, or Firm*—Kanesaka & Takeuchi

[57] ABSTRACT

A semiconductor device is manufactured by a jig. The jig includes a pair of flat heat spreading devices with flat heaters, and an enclosing device for surrounding an assembly of the semiconductor device situated between the heat spreading devices. An assembly of the semiconductor device includes a common electrode plate, semiconductor chips placed above the common electrode, metal contact terminal plates placed above the semiconductor chips, and solder sheets placed at least a portion between the semiconductor device and the common electrode and a portion between the semiconductor chip and the contact terminal plate. The assembly is held between the heat spreading devices, and a reducing gas is supplied to isolate the assembly from atmosphere. The heater plates attached to the heat spreading plates is heated to uniformly heat the solder sheets at a predetermined temperature, and the heater plates are pressed vertically at a predetermined temperature to bond the semiconductor chips to the common electrode plate or to the metal contact terminal plates under pressure. Thus, the heights of the metal contact terminal plates are aligned uniformly.

16 Claims, 3 Drawing Sheets

5,669,546

APPARATUS FOR MANUFACTURING SEMICONDUCTOR DEVICE AND METHOD OF MANUFACTURING THE SEMICONDUCTOR DEVICE USING THE SAME

BACKGROUND OF THE INVENTION AND RELATED ART STATEMENT

The present invention relates to an apparatus for manufacturing a semiconductor device and a method of manufacturing the same. In particular, it relates to soldering of an electrode plate and semiconductor chips in a flat type semiconductor modular device, such as an insulated gate bipolar transistor (IGBT), a bipolar junction transistor (BJT), a MOS field effect transistor (MOSFET), a gate turnoff thyristor (GTO), a diode, and etc. These flat type semiconductor modular devices are used in electric power converting apparatuses, such as inverters for industrial equipment, vehicle driving and etc.

The semiconductor device has been developed to have large capacity in view of market needs. So-called module structures which incorporate a plurality of semiconductor chips in a package have been used for increasing capacity of the semiconductor devices.

In a MOS control device, such as an IGBT, an emitter electrode and a gate electrode are arranged side by side on one major surface of a semiconductor chip. This facilitates connection of a collector formed on a rear surface of the chip to the outside by soldering the IGBT chip on a metal electrode-radiator plate when the IGBT is mounted inside a packaging case. However, the emitter electrode and the gate electrode on the upper side can not be soldered, since the emitter electrode and the gate electrode should be led outside via individual terminals disposed on the packaging case. In the packaging assembly according to the prior art, an electrode plate and an aluminum bonding wire of 300 μm in diameter disposed between the emitter electrode and an outlet terminal are formed on the upper surface of the packaging case.

Though the above described packaging assembly facilitates heat radiation from the side of the collector, the packaging assembly greatly limits a current capacity of the device, since heat is hardly radiated from the emitter side. In the large capacity assembly, the number of the bonding wires connected to the emitter electrodes increases as the current capacity increases, and the number of the bonding wires amounts to several hundreds in a module package into which a plurality of IGBTs is incorporated. As the bonding wires increases, internal wiring inductance increases, which further causes generation of large surge when the IGBT switches. Thus, the limited heat radiation and increased wiring inductance deteriorate the reliability of the semiconductor apparatuses.

In another packaging assembly which is directed to solve the above described problems of limited heat radiation and wiring inductance increase, IGBTs are incorporated inside a flat package like the flat type semiconductor device, and the emitter electrodes and the collector electrodes formed on main surfaces are connected to the outside through area contacts with electrode plates exposed on the upper and lower surfaces of the package. However, since the emitter electrodes of the IGBT extend over and cover gate electrodes through insulation layers, strain may be formed in the gate electrodes when an electrode plate is pressed down in an entire chip area to be contacted with the emitter electrodes. Therefore, this packaging assembly has not been used.

Japanese Patent Application No. H05-184271 describes a MOS control device structure which is provided with a collecting electrode for a current path and for heat radiation in place of the MOS structure on the side of the emitter. This MOS control device structure has been found to be effective for providing pressure contact without exerting excessive pressure to a MOS control electrode.

However, it has been also found by experiments and simulations that the reliability, and the thermal and electrical properties may be badly affected if the thickness and flatness of the constituent elements including a plurality of semiconductor chips are not confined within an extremely small deviation, since it is necessary to uniformly pressurize and contact the semiconductor chips.

FIG. 4 is a sectional view schematically showing a soldering method according to the prior art for soldering IGBT and a common electrode plate on the underside of the IGBT. In FIG. 4, a bonding assembly 10 includes a common electrode plate 1 of copper (Cu) or molybdenum (Mo) to which surface treatment, such as nickel (Ni) plating and etc. is applied; solder sheets 2; semiconductor chips 3, on the back surface of which a surface treatment, such as deposition of a gold (Au) layer and etc. is applied; and guides 4 for accurately positioning the above described assembly elements. The bonding assembly 10 is placed on a belt conveyor 7 and conveyed into a soldering furnace 6.

The soldering furnace 6 is controlled at a temperature above the melting point of the solder, and at a non-oxidation atmosphere by flowing a nitrogen gas ($N_2$) or a hydrogen gas ($H_2$) for preventing the surfaces of the metal and the solder from oxidation and for maintaining the surfaces of the metal and the solder at excellent conditions for soldering. While the bonding assembly 10 is passing through the furnace 6, the solder is melted and the semiconductor chips 3 are bonded to the common electrode plate 1. After the bonding assembly 10 is cooled down, a semiconductor device is further processed by bonding aluminum (Al) wires to the surfaces of the semiconductor chips 3 for main current flow and gate control.

The conventional soldering method of FIG. 4 accompanies following problems in obtaining flat type semiconductor modular devices.

(1) Since the semiconductor chips are placed on the common electrode plate only by their weight, the semiconductor chips may be bonded obliquely by the surface tension of the molten solder at most by the thickness of the solder sheets. The obliquely bonded semiconductor chips may crack by local stress exerted to the chips during contacting the chips with the electrode plate under pressure.

(2) When the semiconductor chips are pressed to solder the chips flatly, the molten solder may flow out.

(3) Since the reducing gas flows through an open tube of the soldering furnace, the soldering atmosphere may not be sufficiently controlled. This insufficiently reducing soldering atmosphere may cause unsoldered local areas (hereinafter simply referred to as "voids"). The voids may further cause deterioration in the electrical and the thermal properties of the semiconductor modular devices.

In view of the foregoing, an object of the present invention is to provide a jig or apparatus for manufacturing a semiconductor modular device and a method for manufacturing a semiconductor modular device using the jig, which facilitates flatly soldering a plurality of semiconductor chips to a common electrode plate without causing any void, and flatly pressing and contacting the semiconductor chips having different chip thicknesses to the common electrode plate simultaneously. Thus, the problems of heat radiation and wiring inductance can be solved.

SUMMARY OF THE INVENTION

The object of the present invention is achieved by a jig or apparatus for manufacturing a semiconductor device. The jig is designed to flatly connect parts of the semiconductor device. The semiconductor device includes a plurality of semiconductor chips having main electrode layers on two major faces; a lower common electrode plate on which each one of major faces of the chips is arranged side by side through solder sheets; and metal contact terminal plates for the semiconductor chips placed on the semiconductor chips. The jig is formed of a pair of flat heater plates; a pair of flat heat spreading plates fixed to the inner sides of the heater plates to face each other; a cylindrical case surrounding a side surface of a laminated structure of the semiconductor device when the laminated structure is disposed between the heat spreading plates; and sealing means sealingly disposed between ends of the cylindrical case and the heater plates, and movable along a longitudinal axis of the cylindrical case.

The object of the present invention is also achieved by a manufacturing method for manufacturing a semiconductor device, including steps of (a) sandwiching between the heat spreading plates of the jig an assembly of the semiconductor device not joined together; (b) filling the cylindrical case with a reducing gas; (c) heating the heater plates with an external heating apparatus so as to uniformly heat the solder at a predetermined temperature; and (d) pressing vertically the heater plates at the predetermined temperature to thereby bond the semiconductor chips to the lower electrode plate under pressure. The predetermined temperature is preferably a temperature at which the solder dissociates to a liquid phase and a solid phase, that is, a temperature at which a liquid phase and a solid phase of the solder coexist. Hereinafter, this temperature is referred to as "two-phase coexisting temperature". And, it is preferable to use the solder which contains from 90.0 to 98.0 wt % of lead and from 10.0 to 2.0 wt % of tin.

By using the solder which contains from 90.0 to 98.0 wt % of lead and from 10.0 to 2.0 wt % of tin at a two-phase coexisting temperature, the solder dissociates to a solid phase and a liquid phase. Since the solder containing the solid and liquid phases is easily deformed under pressure like a lump of clay, the solder in this state facilitates correcting the top position variation of the constituent elements of the bonding assembly when the elements are pressurized and connected by the flat metal plates. Since the electrodes of the semiconductor chips are taken out through the contact terminals, it is not necessary to connect by the wires. The electrodes connected by the bonding wires are the gate electrodes, so that inductance by the internal wirings is reduced. Since the top positions of the contact terminals are leveled equally, the semiconductor chips are prevented from cracking when the pressure is applied. Also, since the semiconductor chips are pressed vertically by a pair of common electrode plates and uniform contact areas are established, the heat radiation property of the semiconductor chips is improved.

The pressure bonding is conducted in a gastight cylindrical case filled with a non-oxidation gas by the jig or apparatus as explained above. Thus, it is possible to prevent the bonding surfaces and the solder from oxidation. Also, since the connection is made under pressure, the voids are expelled from the contact surfaces. Due to this, the electrical and thermal properties of the semiconductor devices are improved.

DETAILED DESCRIPTION OF A PREFERRED EMBODIMENTS

Figure 1:
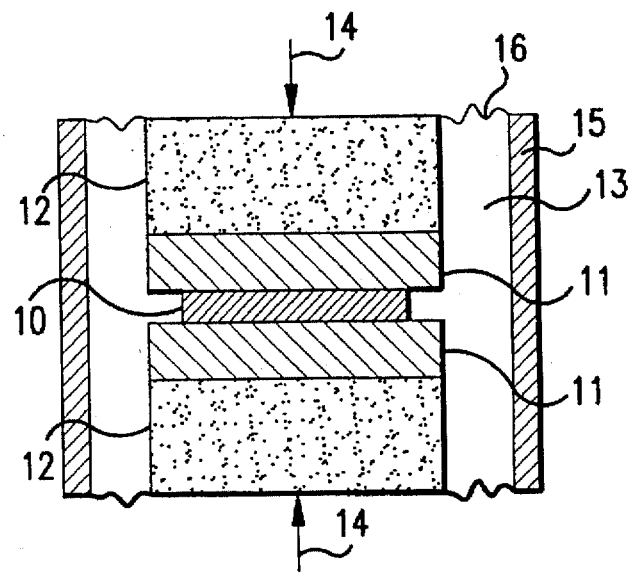
FIG. 1 is a section view showing an embodiment of a jig or apparatus for manufacturing a semiconductor device according to the present invention.

FIG. 1 is a sectional view showing an embodiment of a jig or apparatus for manufacturing a semiconductor device according to the present invention. In FIG. 1, the jig is comprised of a pair of brass heat spreading plates 11; a pair of carbon heater plates 12; a gastight chamber 13 which includes a heat resistant glass case 15 and bellows 16; and a press 14. FIG. 2 shows an enlarged sectional view of a bonding assembly 10 of FIG. 1. In FIG. 2, the bonding assembly 10 includes contact terminals 5; semiconductor chips 3; solder sheets 2; and a common electrode plate 1. The heater plates 12 are heated by high frequency induction, and the heat spreading plates 11 are heated by the heat from the heater plates 12. The heat spreading plates 11 are controlled over the entire surfaces within a temperature deviation of ±1° C., so that the bonding assembly 10 is heated uniformly, and the solder sheets 2 are controlled at a temperature at which solid and liquid phases of the solder coexist. The chamber 13 is kept gas-tightly with the heat resistant glass case 15 and the bellows 16 to facilitate bonding the bonding assembly 10 in a non-oxidation atmosphere, such as in $N_2$ and etc. Instead of the bellows, a pair of O-rings may be used.

Figure 3:
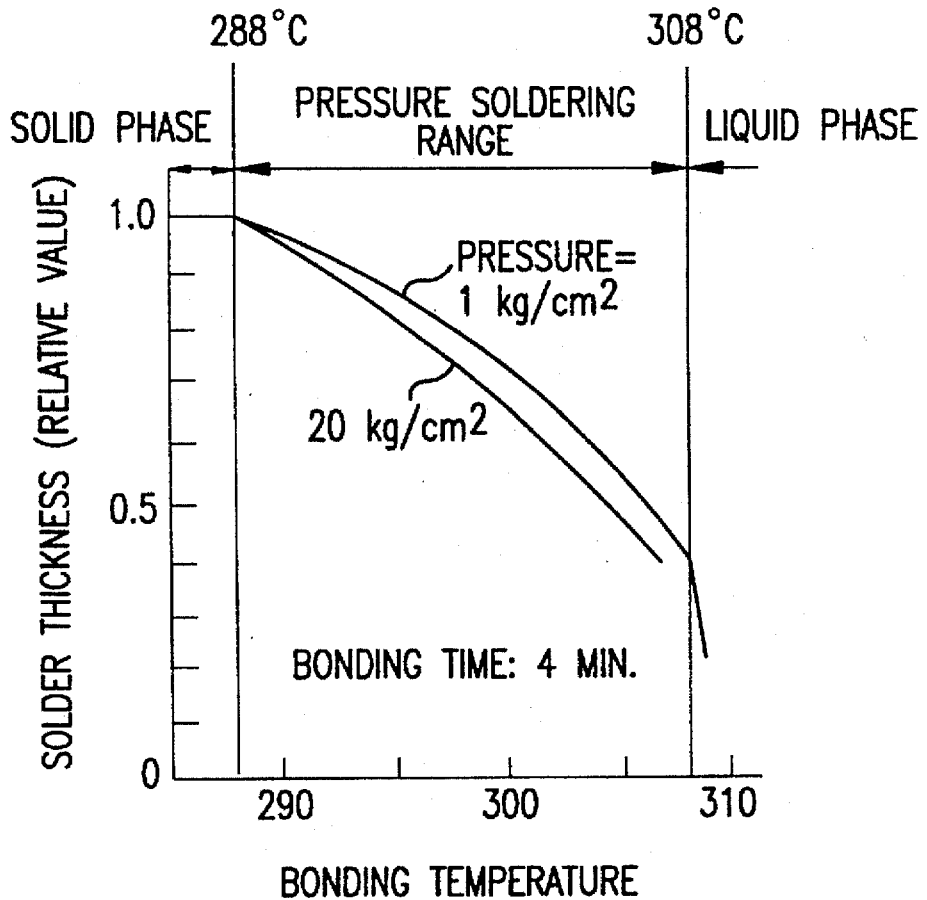
FIG. 3 is a graph showing the relation between the bonding temperature and the solder thickness with the applied pressure as a parameter.
Figure 4:
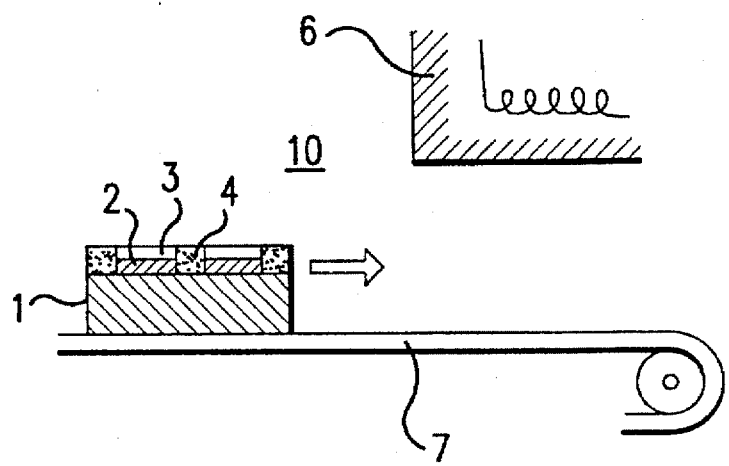
FIG. 4 is a section view schematically showing a soldering method according to the prior art.

FIG. 3 is a graph showing the relation between the bonding temperature and the solder thickness with the applied pressure as a parameter. The solder used contains 92.5 wt % of lead (Pb) and 7.5 wt % of tin (Sn). The two-phase coexisting temperature of this solder ranges between 288° C. and 308° C. FIG. 3 indicates that the height variation over the bonding assembly, i.e. the contact terminals 5 and the semiconductor chips 3, can be compensated by the pressing deformation of the molten solder between 288° C. and 308° C., that is in the two-phase coexisting temperature range, and in the applied pressure range between 1 kg/cm² and 20 kg/cm². In accordance with the theory, a solder having a composition between 90.0 wt % of Pb and 10.0 wt % of Sn, and 98.0 wt % of Pb and 2.0 wt % of Sn may be used.

A soldering method which uses the jig of FIG. 1 will be explained below.

Figure 2A:
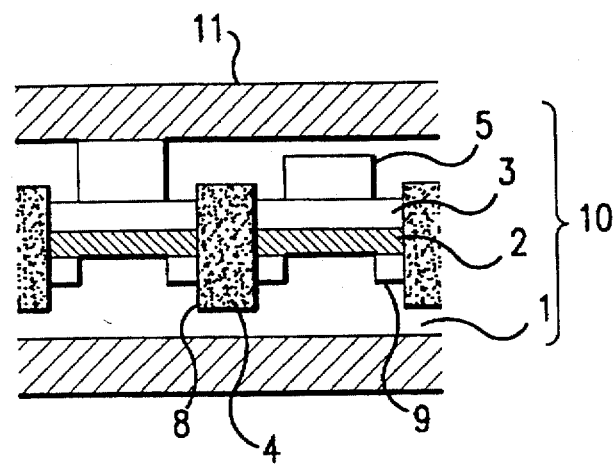
FIG. 2(a) shows an enlarged section view of an assembly of FIG. 1 before pressure bonding.
Figure 2B:
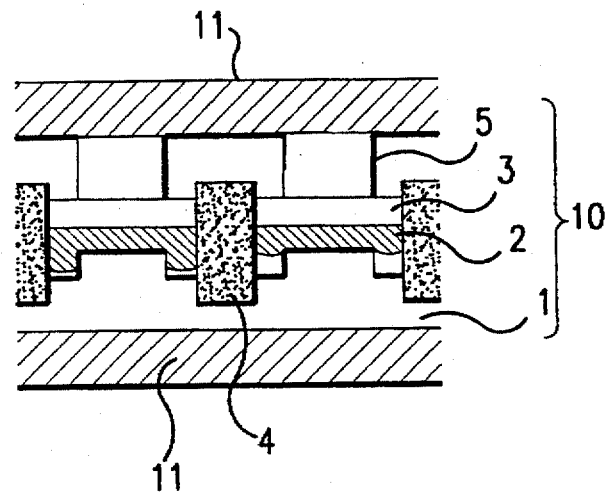
FIG. 2(b) shows an enlarged section view of the assembly after pressure bonding.

FIG. 2(a) shows a sectional view of the main part of the bonding assembly before bonding, and FIG. 2(b) shows a sectional view of the main part of the bonding assembly after bonding. The bonding assembly 10 includes copper or molybdenum contact terminals 5; semiconductor chips 3 like IGBTs, diodes and etc.; solder sheets 2 containing 92.5 wt % of Pb and 7.5 wt % of Sn; and a common lower electrode plate 1. In the electrode plate 1, trenches 8 for positioning guides 4 and trenches 9 for receiving excessive solder at a time of bonding are formed.

In the bonding method, the guides 4 are placed on the common electrode plate 1, and then the solder sheets 2, semiconductor chips 3 and contact terminals 5 are laminated one by one in this order. The bonding assembly 10 thus assembled is placed between the heat spreading plates 11. The heater plates 12 are heated by high frequency induction so as to heat the bonding assembly 10 through the heat spreading plates 11. The temperature of the bonding assembly 10 is controlled at a two-phase coexisting temperature between 288° C. and 308° C. As soon as the bonding assembly 10 is sufficiently heated, soldering is conducted by pressing the bonding assembly 10 with a press 14. The pressure of the press 14 is maintained between 1 kg/cm$^2$ and 20 kg/cm$^2$ in the two-phase coexisting temperature range as indicated by FIG. 3.

The contact terminals 5, the solder sheets 2, the semiconductor chips 3 and the common lower electrode plate 1 can be fabricated in thickness in a tolerance of ±5 μm. However, the top positions of the bonding assembly may vary at most by 40 μm as shown in FIG. 2(a). According to the prior art, it is difficult to uniformly press a plurality of semiconductor chips and to obtain excellent electrical and thermal properties when such the top position variation of the bonding assembly exists.

In contrast to this, by heating the bonding assembly at a two-phase coexisting temperature of the solder according to the present invention, the solder under the high semiconductor chip is more pressed so that the tops of the high part and the low part of the bonding assembly may be leveled equally as shown in FIG. 2(b). By pressing down the thinnest part of the bonding assembly by 5 μm or more by controlling the pressure, the heating temperature and the bonding time, a plurality of semiconductor chips may not only be uniformly contacted, but also bonded under pressure without causing any void. Thus, the present invention facilitates obtaining electrically and thermally excellent contact, and highly reliable semiconductor modular devices or semiconductor apparatuses.

In this embodiment, the top level or height variation of 40 μm is reduced down to less than 5 μm by vertically pressing the bonding assembly with two flat metal plates. Measurements on electrical resistance and thermal characteristics have confirmed that an excellent pressure contact is obtained by confining the height deviation within ±2.5 μm. And, an ultrasonic examination has revealed that the present gastight bonding jig which keeps an excellent reducing atmosphere, and the present bonding under pressure which prevents voids from remaining, facilitate forming of void-less bonding.

In the above example, after the assembly 10 is formed, an upper common electrode plate (not shown) is placed on the contact terminals 5 and is assembled with the assembly 10 under pressure to form a complete package. Since the height of the terminals 5 is substantially the same, when the upper common electrode plate is pressed on the contact terminals 5, local stress is not formed, and a good contact with little contact resistance is obtained.

Figure 5:
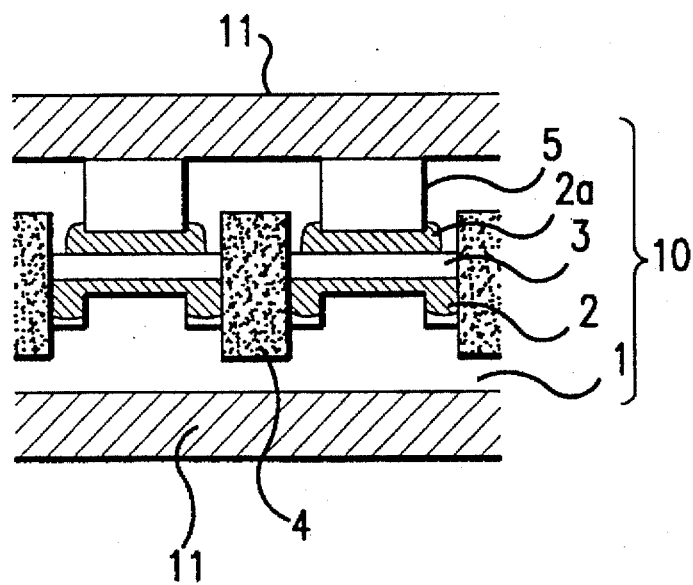
FIGS. 5 and 6 are enlarged section views, similar to FIG. 2(b), for showing other embodiments of the invention.

FIG. 5 shows a second embodiment 10 of the assembly of the invention, wherein a solder sheet 2a is disposed between the contact terminal 5 and the semiconductor chip 3, in addition to the solder plate 2 between the common electrode plate 1 and the semiconductor chip 3. In this case, even if the variation of height of the contact terminals 5 is large, the height can be made flat. Also, it is possible to remove the solder plate 2 between the common electrode plate 1 and the semiconductor chip 3. In this case, when the upper common electrode plate is placed on the contact terminals 5 and is assembled together, the common electrode plate 1 and the semiconductor chips 3 can properly contact together without soldering.

Figure 6:
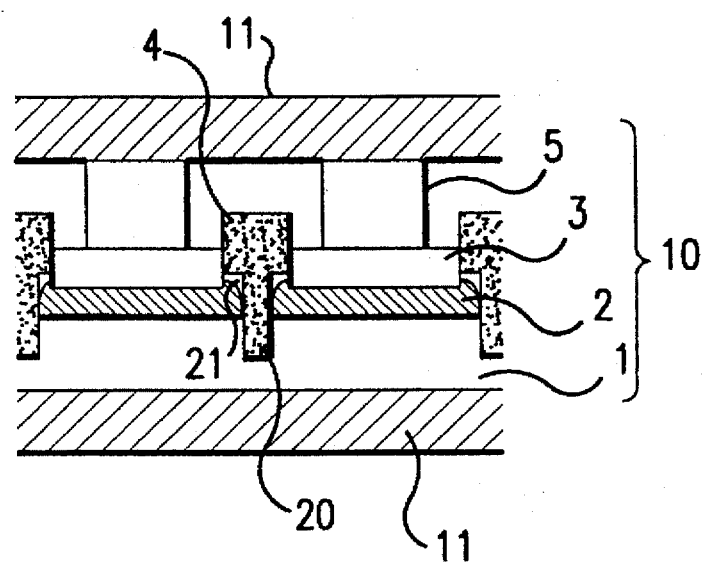

FIG. 6 shows a third embodiment 10 of the assembly. In this embodiment, a positioning guide 4 includes a narrow portion 20 so that a space 21 is formed between the narrow portion 20 and the semiconductor chip 3. When the solder plate 2 is compressed, an excess amount of solder enters into the space 21. Thus, the contact terminals 5 can be compressed, and the height thereof can be made flat.

According to the present invention, the solder is kept at its two-phase coexisting temperature and a plurality of semiconductor chips is bonded under pressure with a common electrode plate. Thus, the semiconductor chips are simultaneously bonded flatly on the common electrode plate without any void. Accordingly, the present invention facilitates obtaining large capacity semiconductor modular devices which can be cooled from both sides through the pressure contacts.

What is claimed is:

1. A jig for manufacturing a semiconductor device including a plurality of semiconductor chips, a common electrode plate for the semiconductor chips situated under the semiconductor chips, terminal plates situated on the semiconductor chips, and solder sheets for connecting the semiconductor chips to at least one of the common electrode plate and the terminal plates, said jig comprising:

a pair of flat heater plates facing each other;

a pair of flat heat spreading means fixed to said heater plates to face each other for sandwiching and uniformly heating an assembly for said semiconductor device, said assembly being placed between the heat spreading means such that the common electrode plate and the terminal plates contact the heat spreading means, and enclosing means for surrounding the assembly, said enclosing means including a hollow case surrounding said heater plates, said heat spreading means and said assembly, and sealing means connected to the hollow case for sealing the same so that the assembly can be compressed between the heat spreading means.

2. A jig according to claim 1, wherein said hollow case includes upper and lower portions connected to outer peripheral edges of said heater plates by the sealing means so that the heater plates are movable along an axis of said case while enclosing said heat spreading means and said assembly therein.

3. A jig according to claim 2, further comprising a press for pressing the heater plates while the solder plates dissociate in a solid phase and a liquid phase.

4. A method of manufacturing a semiconductor device comprising:

placing between heat spreading plates an assembly for the semiconductor device including a common electrode plate, semiconductor chips placed above the common electrode plate, metal contact terminal plates placed on the semiconductor chips, and solder sheets situated at least one of a portion between the common electrode plate and the semiconductor chip and a portion between the semiconductor chip and the metal contact terminal plate, supplying a non-oxidation gas to isolate the assembly from atmosphere, heating heater plates attached to heat spreading plates to uniformly heat said solder sheets at a predetermined temperature; and pressing vertically the heater plates at the predetermined temperature to bond the semiconductor chips to at least one of the common electrode plate and the metal contact terminal plates by means of the solder sheets under pressure so that the heights of the metal contact terminal plates are aligned uniformly.

5. A method of manufacturing a semiconductor device according to claim 4, wherein said solder sheets dissociate to a liquid phase and a solid phase at said predetermined temperature.

6. A method of manufacturing a semiconductor device according to claim 5, wherein said assembly for the semiconductor device further includes positioning guides placed on the common electrode plate to isolate the semiconductor chips.

7. A method of manufacturing a semiconductor device according to claim 6, wherein said common electrode plate includes grooves near the solder sheets, said solder sheets, when melted and pressed, partly entering into the grooves to adjust the height of the semiconductor chips.

8. A method of manufacturing a semiconductor device according to claim 6, wherein said positioning guide includes portions for forming spaces relative to the semiconductor chips when contacting with the semiconductor chips, said solder sheets, when melted and pressed, partly entering into the spaces to adjust the height of the semiconductor chips.

9. A method of manufacturing a semiconductor device according to claim 6, wherein said solder comprises from 90.0 to 98.0 wt % of lead and from 10 to 2.0 wt % of tin.

10. A method for soldering semiconductor chips and electrode plates, comprising, heating solder which lies between said semiconductor chips and said electrode plates to a predetermined temperature to dissociate the solder to a liquid phase and a solid phase, and providing pressure between the semiconductor chips and the electrode plates to connect together.

11. The soldering method as claimed in claim 10, wherein said solder comprises from 90.0 wt % to 98.0 wt % of lead and from 10.0 wt % to 2.0 wt % of tin.

12. The soldering method as claimed in claim 10, wherein said temperature comprises the range from 288° C. to 308° C.

13. The soldering method as claimed in claim 12, wherein the pressure comprises the range from 1 kg/cm$^2$ to 20 kg/cm$^2$.

14. The soldering method as claimed in claim 10, wherein said electrode plates are molybdenum.

15. The soldering method as claimed in claim 10, wherein said semiconductor chips are IGBTs.

16. The soldering method as claimed in claim 10, wherein the pressure between the semiconductor chips and the electrode plates is applied to align height between the semiconductor chips and the electrode plates.

* * * * *

UNITED STATES PATENT AND TRADEMARK OFFICE
CERTIFICATE OF CORRECTION

PATENT NO. : 5,669,546
DATED     : September 23, 1997
INVENTOR(S) : Fumiaki Kirihata It is certified that error appears in the above-indentified patent and that said Letters Patent is hereby corrected as shown below:

In cover page, ABSTRACT section, line 5, change "An" to --The--;
line 15, change "is" to --are--;

In column 1, line 49, change "increases" to --increase--;

In column 2, line 32, change "oxidation" to --being oxidized--; and

In column 3, line 63, change "oxidation" to --being oxidized--.

Signed and Sealed this

Twenty-seventh Day of January, 1998

Attest:

BRUCE LEHMAN

*Attesting Officer*  *Commissioner of Patents and Trademarks*